(12) United States Patent
Chiang et al.

(10) Patent No.: US 8,803,249 B2
(45) Date of Patent: Aug. 12, 2014

(54) PROFILE PRE-SHAPING FOR REPLACEMENT POLY GATE INTERLAYER DIELECTRIC

(75) Inventors: Chih-Wei Chiang, Zhubei (TW); Kuang-Cheng Wu, Zhubei (TW); Wen-Long Lee, Hsinchu (TW); Po-Hsiung Leu, Lujhu Township (TW); Ding-I Liu, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/570,527

(22) Filed: Aug. 9, 2012

(65) Prior Publication Data
US 2014/0042553 A1 Feb. 13, 2014

(51) Int. Cl.
*H01L 29/78* (2006.01)

(52) U.S. Cl.
USPC ..... 257/401; 257/368; 257/288; 257/E29.255

(58) Field of Classification Search
USPC ............................. 257/288, 368, 401, E29.255
See application file for complete search history.

(56) References Cited

U.S. PATENT DOCUMENTS

2004/0232477 A1* 11/2004 Iwata et al. .................... 257/315
2005/0118770 A1* 6/2005 Nandakumar et al. ......... 438/305
2008/0157207 A1* 7/2008 Rachmady et al. ........... 257/365
2010/0032670 A1* 2/2010 Aggarwal et al. ............... 257/48
2010/0112798 A1* 5/2010 Lai et al. ........................ 438/591
2012/0108027 A1* 5/2012 Xiong et al. ................... 438/303
2012/0286375 A1* 11/2012 Cai et al. ........................ 257/412
2013/0071977 A1* 3/2013 Scheiper et al. ............... 438/299
2013/0082311 A1* 4/2013 Cheng et al. .................. 257/288
2013/0270569 A1* 10/2013 Chang et al. .................... 257/66
2013/0285157 A1* 10/2013 Yin et al. ....................... 257/401
2013/0292780 A1* 11/2013 Pinto et al. .................... 257/369

* cited by examiner

*Primary Examiner* — Victor A Mandala
(74) *Attorney, Agent, or Firm* — Eschweiler & Associates, LLC

(57) ABSTRACT

Some embodiments relate to an integrated circuit (IC). The IC includes a semiconductor substrate having an upper surface with a source region and drain region proximate thereto. A channel region is disposed in the substrate between the source region and the drain region. A gate electrode is disposed over the channel region and separated from the channel region by a gate dielectric. Sidewall spacers are formed about opposing sidewalls of the gate electrode. Upper outer edges of the sidewall spacers extend outward beyond corresponding lower outer edges of the sidewall spacers. A liner is disposed about opposing sidewalls of the sidewall spacers and has a first thickness at an upper portion of liner and a second thickness at a lower portion of the liner. The first thickness is less than the second thickness. Other embodiments are also disclosed.

19 Claims, 4 Drawing Sheets

PROFILE PRE-SHAPING FOR REPLACEMENT POLY GATE INTERLAYER DIELECTRIC

BACKGROUND

Over the last four decades, the density of integrated circuits (ICs) has increased by a relation known as Moore's law. Stated simply, Moore's law says that the number of transistors on ICs doubles approximately every 18 months. Thus, as long as the semiconductor industry can continue to uphold this simple "law," ICs double in speed and power approximately every 18 months. In large part, this remarkable increase in the speed and power of ICs has ushered in the dawn of today's information age. Unlike laws of nature, which hold true regardless of mankind's activities, Moore's law only holds true only so long as innovators overcome the technological challenges associated with it.

DETAILED DESCRIPTION

Figure 1:
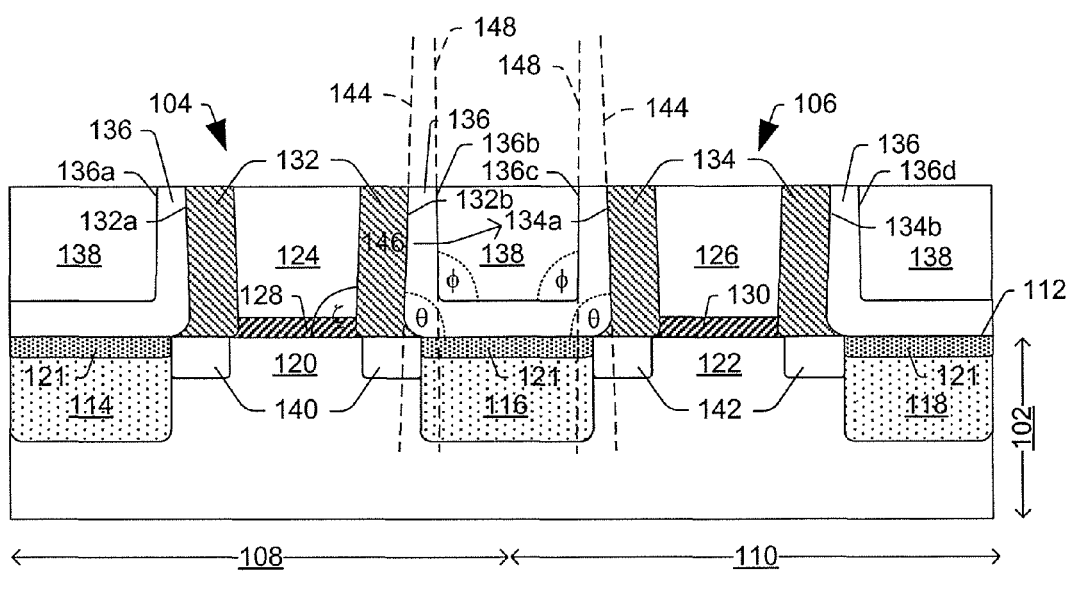
FIG. 1 shows an example of an IC that includes neighboring sidewalls with a pre-shaped profile, wherein the pre-shaped profile limits void-type defects in an interlayer dielectric (ILD) formed between the neighboring sidewalls.

One or more implementations of the present invention will now be described with reference to the attached drawings, wherein like reference numerals are used to refer to like elements throughout. The drawings are not drawn to scale.

To continue to keep pace with Moore's law, features on ICs are spaced more closely together with each new generation of devices. For example, as of 2007, several industry leaders have been producing 65 nm ICs. In this technology, printed line widths (e.g., transistor gate lengths) can reach as low as 25 nm on a nominally 65 nm process, while the pitch between two lines can be greater than 130 nm. As a bulk silicon crystal has a lattice constant of 0.543 nm, the smallest transistors in 65 nm processes are on the order of 100 atoms across. As of 2012, several industry leaders are now delivering 22 nm ICs, with 16 nm IC expected to be delivered sometime in approximately 2013.

Regardless of the exact dimensions involved, as features are packed more densely together on ICs, topology of the individual layers becomes more and more important. Problems can arise when neighboring gate electrodes are packed closely together in modern semiconductor manufacturing processes. In particular, neighboring sidewalls of adjacent gate electrodes and/or liners formed there over may suffer from bread-loafing, wherein upper regions of the sidewalls taper outward relative to lower regions of the sidewalls, much like a top region of a loaf of bread can "bread-loaf" out of a bread pan. When two neighboring gate electrodes in close proximity each show bread-loafing, it can be difficult during manufacturing to sufficiently fill spaces between the neighboring sidewalls of the gate electrodes and/or liners formed there over. If left unfilled, these voids or gaps between neighboring gate electrodes can ultimately lead to defects in the final device.

To prevent void-related defects between neighboring gate electrodes, some embodiments of the present disclosure use profile pre-shaping to alter the topology of sidewalls to reduce bread-loafing topologies. In some instances, the pre-shaping forms a u-shape or v-shape between the neighboring gate electrode structures, which can be effectively filled without the presence of voids. In this way, the disclosed techniques limit defects to improve yields and enhance product reliability.

FIG. 1 shows a cross-sectional view of an IC 100 in accordance with some embodiments. The IC 100 is formed on a semiconductor substrate 102 and includes first and second neighboring transistors 104, 106 formed over active regions 108, 110, respectively, in the substrate 102. In some embodiments, the active regions 108, 110 can correspond to one or more well regions although they can also correspond to the bulk silicon substrate itself.

Source/drain regions, which have a first conductivity type that is opposite that of the substrate (or opposite that of the well regions, if present), are formed near an upper substrate surface 112. In FIG. 1's example, the first transistor 104 includes first source/drain region 114 and second source/drain region 116; while the second transistor 106 includes second source/drain region 116 and third source/drain region 118. Strain-inducing regions 121 (e.g., SiGe regions) may also be present in some embodiments. Channel regions 120, 122 are formed in active regions 108, 110, respectively, and have a second doping type opposite the first doping type. The channel regions 120, 122 separate the source/drain regions for the first and second transistors 104, 106, respectively.

Conductive gate electrodes 124, 126 are formed over the respective channel regions 120, 122, and are separated from the channel regions by respective gate dielectrics 128, 130. Sidewall spacer pairs 132, 134 are disposed about opposite sides of the gate electrodes 124, 126, respectively, and a liner layer 136 is conformally disposed along outer sidewalls of the sidewall spacer pairs 132, 134. An interlayer dielectric (ILD) 138 is disposed over the liner layer 136. Source/drain extension regions 140, 142, which may also be referred to as lightly-doped drain (LDD) regions and which have the first doping type (although at a lower doping concentration than the source/drain regions), are disposed under the sidewall spacer pairs 132, 134. Interconnect layers, such as vias and metal layers, are disposed over the gate electrodes 124, 126, but are not shown for purposes of simplicity.

Notably in FIG. 1, each outer sidewall (e.g., 132b) of a sidewall spacer pair (e.g., 132) lies on a line (e.g., 144) that traverses the upper substrate surface 112 at an acute angle, $\theta$, wherein $\theta$ is measured from the upper substrate surface 112 to the outer sidewall of a spacer (e.g., 132b on line 144) without passing through the corresponding sidewall spacer 132. Acute angle $\theta q$ and obtuse angle $\theta' q'$ (on the outer sidewall of of gate electrode) are approximately approximately supplementary angles. That is, $\theta$ plus $\theta'$ equal approximately 180°. The fact that angle $\theta' q'$ is obtuse helps to ensure that a replacement gate electrode (e.g., 124) can be effectively filled within a sidewall spacer pair (e.g., 132). Absent countermeasures (e.g., pre-shaping techniques as set forth herein), this acute angle, $\theta$ can cause the top of the void susceptible region 146 between sidewalls 132b, 132c to "pinch off" later in the process.

Therefore, in the present disclosure, the liner layer 136, which is formed prior to the formation of ILD 138, is "pre-shaped" to produce outer sidewalls (e.g., 136b, 136c) exhibiting obtuse or perpendicular angle, $\phi$. The liner outer sidewalls (e.g., 136b, 136c) lie generally about line 144 traversing the upper substrate surface 112 such that obtuse or right angle φ is measured from the upper substrate surface 112 to the liner outer sidewall 136b, 136c without passing through the liner layer 136. In this way, the liner layer 136 is pre-shaped to "open up" to the top of the space between the neighboring gate electrodes 124, 126, and allows the ILD 138 to be formed between the neighboring gate electrodes with few or no voids. This structure ultimately helps improve yields and produces more reliable devices than conventional approaches.

FIG. 1 shows an example where the second source/drain region 116 is shared between the first and second transistors 104, 106, as this arrangement puts the transistors 104, 106 in closer proximity to one another. This closer proximity makes this structure particularly prone to filling issues (e.g., formations of voids) which are alleviated with the pre-shaping techniques described herein, as will be appreciated in more detail below. Even if a shared source/drain region is not used, void-type ILD defects are risk when a gap, which is to be filled with an interlayer dielectric, has sidewalls separated by approximately 100 nn or less, or even by 40 nm or less. Of course, the proposed techniques can also be used in other arrangements where features are spaced further apart, but the proposed techniques find particular usefulness in these tightly packed arrangements.

Figure 2:
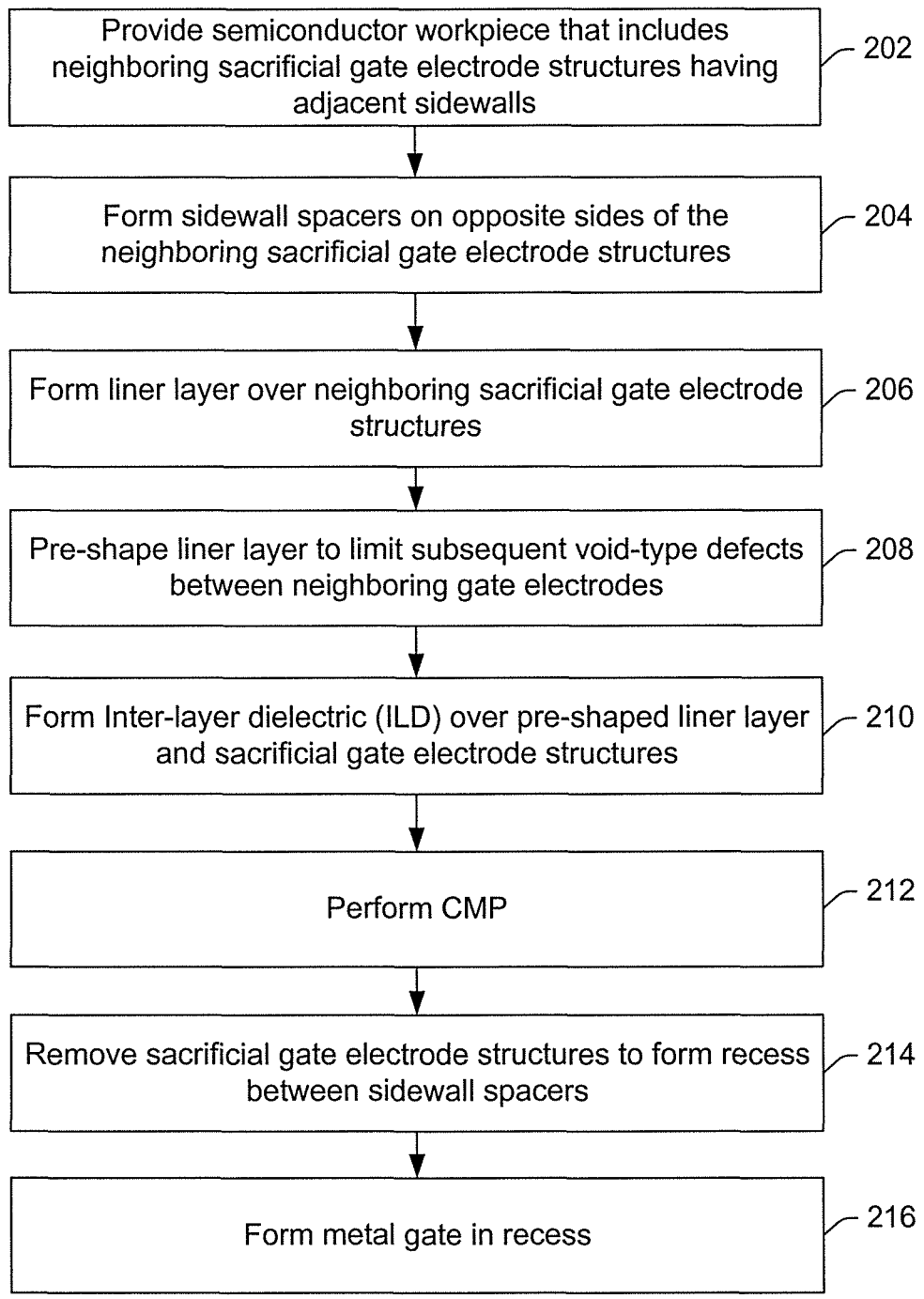
FIG. 2 is a flow-chart illustrating a methodology for manufacturing an IC in accordance with some embodiments.

FIG. 2 shows a method of manufacturing in flow-chart format, while FIGS. 3A-3F (discussed further herein) show a manufacturing method in accordance with some embodiments. These manufacturing methods are now described below.

FIG. 2's method 200 starts at 202, where a semiconductor workpiece is provided. The workpiece includes neighboring gate electrode structures having neighboring sidewalls. The neighboring sidewalls are angled so a gap between the neighboring sidewalls is smaller near upper regions of the sidewalls and is larger near lower regions of the sidewalls.

In 204, the sidewall spacers are formed on opposite sides of respective neighboring sacrificial gate electrode structures. The sidewall spacers can be conformal to the sidewalls of the gate electrode, and/or can have approximately the same thickness at an upper region of the gate electrode sidewalls as at a lower region of the gate electrode sidewalls.

In 206, a liner layer is formed over the sidewall spacers and neighboring gate electrode structures. Like the sidewall spacers, the liner layer can be conform to an outer sidewall of the sidewall spacers, and/or can have approximately the same thickness at an upper region of the gate electrode sidewalls as at a lower region of the gate electrode sidewalls.

In 208, the liner layer is pre-shaped to change its sidewalls so that the liner layer sidewall for a perpendicular or obtuse angle with respect to an upper substrate surface. In some embodiments, this can be accomplished by thinning an upper region of the liner layer sidewall to a greater degree than a lower region of the liner layer sidewall. In this way, the liner layer can be pre-shaped to make it more resistant to ILD void-type defects being formed.

In 210, an interlayer dielectric (ILD) is formed over the pre-shaped liner layer and gate electrode structures.

In 212, CMP is performed to planarize an upper surface of the workpiece. In addition to planarization, this CMP operation exposes an upper surface of the sacrificial gate electrodes.

In 214, after CMP has been performed, the sacrificial gate electrodes are selectively removed to form respective recesses in the planarized workpiece surface.

In 216, metal is formed over the workpiece. The metal fills in the recesses to form metal gate electrodes for the respective transistors.

To show a specific example of how FIG. 2's manufacturing process can be implemented, FIGS. 3A-3F show a series of cross sectional views at various stages of the manufacturing process. Although these cross-sectional views show one example of how the manufacturing methodology 200 could be carried out, FIGS. 3A-3F do not limit the scope of the present disclosure in any way. Thus, while methods illustrated and described herein may be illustrated and/or described as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Further, one or more of the acts depicted herein may be carried out in one or more separate acts and/or phases, and are not limited to the structures illustrated in FIGS. 3A-3F.

Figure 3A:
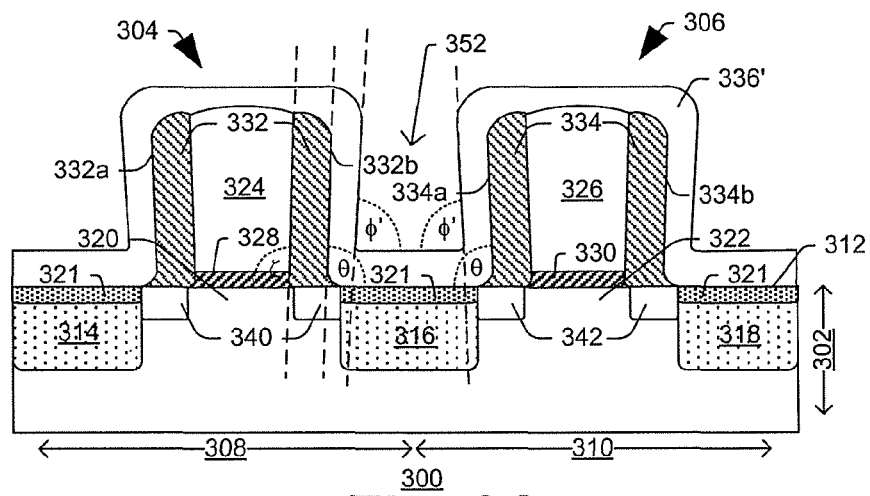
FIGS. 3A-3F illustrate a series of cross-sectional views depicting a method of manufacturing an IC consistent with FIG. 2's methodology.

In FIG. 3A, a semiconductor workpiece 300 including a bulk semiconductor substrate 302 is provided. It will be appreciated that "semiconductor substrate" as referred to herein may comprise any type of semiconductor material including a bulk silicon wafer as illustrated, a binary compound substrate (e.g., GaAs wafer), a ternary compound substrate (e.g., AlGaAs), or higher order compound wafers, among others. Further, the term semiconductor substrate can also encompass structures that include non semiconductor materials such as oxide in silicon-on-insulator (SOI), partial SOI substrate, polysilicon, amorphous silicon, or organic materials, among others. In some embodiments, semiconductor substrates can also include multiple wafers or dies which are stacked or otherwise adhered together. Semiconductor substrates can include wafers which are cut from a silicon ingot, and/or any other type of semiconductor/non-semiconductor and/or deposited or grown (e.g. epitaxial) layers formed on an underlying substrate.

FIG. 3A's illustrated substrate 302 includes first and second neighboring transistor structures 304, 306 formed over first and second active regions 308, 310, respectively. The neighboring transistor structures 304, 306 include respective source/drain regions 314, 316, 318, which can have a first conductivity type opposite that of the bulk substrate 302 (or opposite that of well regions, if present). Channel regions 320, 322 separate the source/drains for the first and second transistor structures 304, 306, respectively, and have a second doping type opposite the first doping type. Sacrificial gate electrodes 324, 326, which are typically made of polysilicon, are separated from the channel regions 320, 322, respectively via gate dielectric 328, 330, respectively. The sacrificial gate electrodes 324, 326 often have tapered sidewalls that establish an obtuse angle, ζ, which facilitates efficient removal of sacrificial gate electrodes 324, 326 and subsequent metal filling. The angle, ζ, can be tuned depending on the pressure and plasma density used to etch the sacrificial gate electrodes 324, 326. Strain-inducing regions 321 (e.g., SiGe regions) may also be present in some embodiments to induce strain in the channel regions 320, 322 to enhance carrier mobility.

Sidewall spacer pairs 332, 334, which can be made of a nitride, oxide, or oxynitride, for example, are disposed about opposite sides of the sacrificial gate electrodes 324, 326, respectively. The sidewall spacer pairs 332, 334 often have sidewalls with an acute angle, θ, which is often supplementary with angle, ζ.

A liner layer 336', which is usually made of silicon nitride to act as a contact etch stop layer but which can also be made of oxide, oxynitride or other materials, is conformally disposed along outer sidewalls 332a, 332b, 334a, 334b of the sidewall spacer pairs 332, 334 respectively. Unfortunately, the liner layer 336', which forms an acute angle φ' often ranging from 60° to 90° between its sidewall and upper substrate surface 312, tends to "bread loaf" over gap 352. The acute angle φ' is often substantially equal to θ, although they could be different. This bread loafing in combination with the close proximity of the neighboring transistor structures 304, 306; tends to make it difficult to effectively fill in gap 352 between the neighboring transistor structures 304, 306.

Figure 3B:
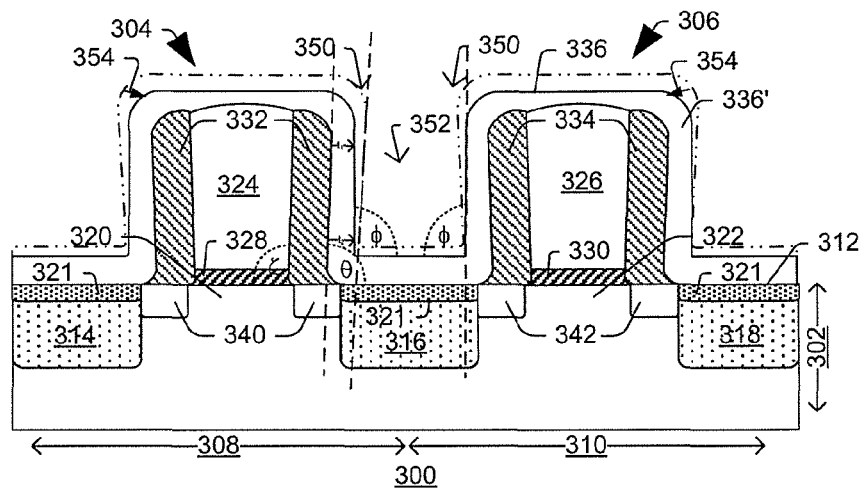

Therefore, in FIG. 3B, a pre-shaping process is used to thin the liner layer upper regions 350 (see arrow 354) to form an obtuse angle φ between the liner layer sidewall 306' and upper substrate surface. Rather the liner layer upper regions 350 "pinching" together at an acute angle φ' as shown in FIG. 3A, the pre-shaping of FIG. 3B results in an obtuse or perpendicular angle φ that tends to "open up" the gap 352 between neighboring electrodes so the gap 352 can be filled more effectively. This pre-shaping can be accomplished by sputter-etching (e.g., argon sputter etching), wherein the endpoint for this pre-shaping is typically a predetermined time value. In sputter etching, a stream of ions is directed downward (e.g., perpendicular) towards the surface of the workpiece to erode away exposed surfaces of the workpiece. For example, fluorine radicals can be produced in a plasma with an RF bias for ion bombardment. Because the liner layer's upper regions 350 are relatively thin in the vertical direction, they are eroded completely away while other vertically thicker regions remain in place. Thus, the pre-shaping results in a first thickness $t_1$ at an upper portion of liner layer 306' and a second thickness $t_2$ at a lower portion of the liner layer 306', wherein the first thickness is less than the second thickness. For example, in some embodiments, the first thickness t1 is in the range of 65-80 Angstroms (A), and the second thickness t2 is in the range of 75-90 A. In some embodiments, the obtuse or perpendicular angle can be equal to 90° and/or less than approximately 120°.

Figure 3C:
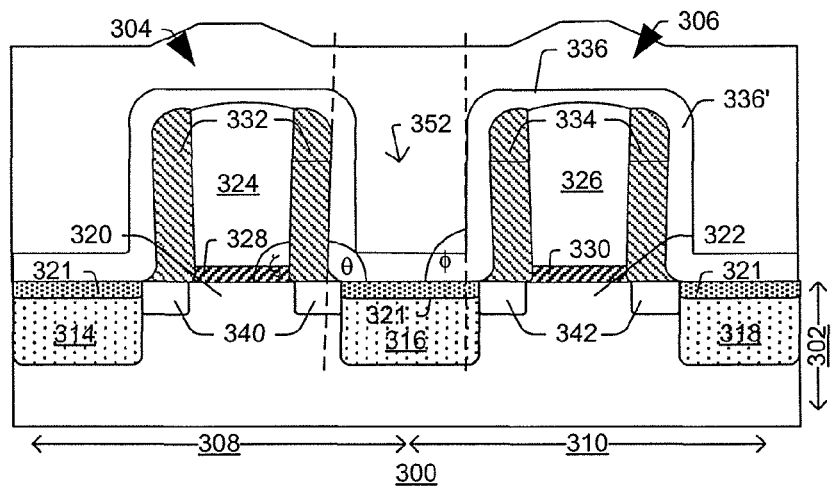

In FIG. 3C, after pre-shaping has been carried out, an interlayer dielectric (ILD) 404 is formed. In some embodiments, the ILD 404 can be formed by a high density plasma (HDP) process. Compared to conventional approaches that do not use pre-shaping (and which can experience voids in gap 352 between neighboring gate electrodes), FIG. 3C shows a substantially continuous and void-free ILD in gap 352 between the neighboring gate electrodes.

Figure 3D:
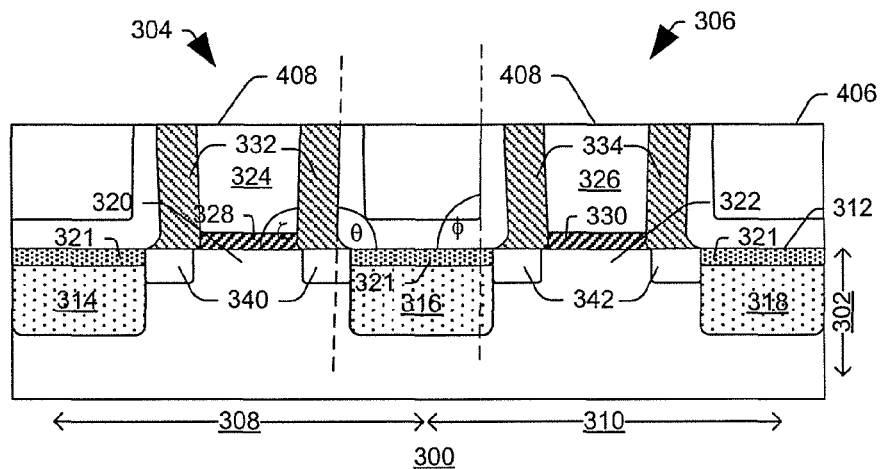

In FIG. 3D, CMP has been carried out to remove an upper portion of the workpiece, thereby providing a workpiece with a planarized upper surface 406. In addition to providing the planarized surface 406, the CMP also exposes a sacrificial gate electrode surface 408.

Figure 3E:
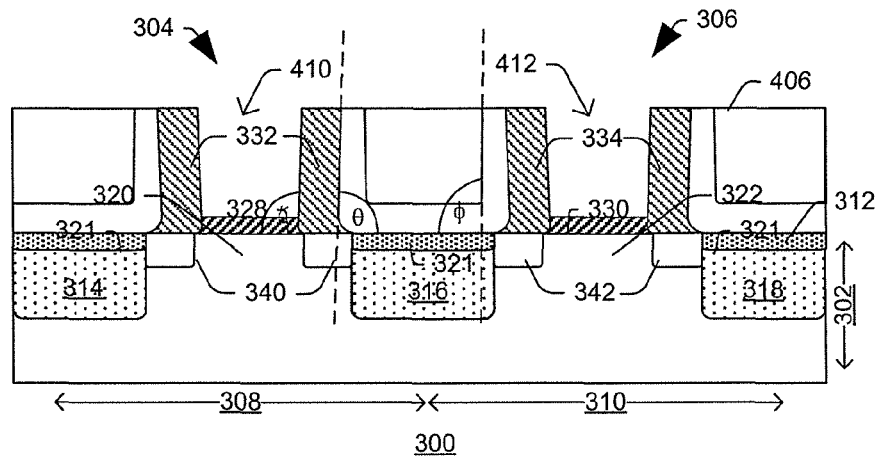

In FIG. 3E, a selective etch is used to remove the sacrificial gate electrodes 324, 326. This selective removal of the sacrificial gate electrodes forms recesses 410, 412 in the planarized upper surface 406.

Figure 3F:
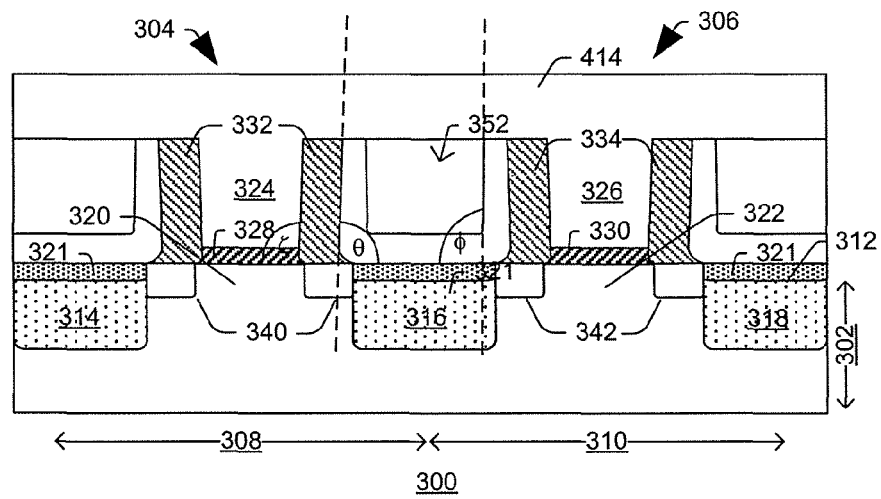

In FIG. 3F, a metal layer 414 is formed over the workpiece. The metal 414 extends downward into the recesses 410, 412 to form metal gate electrodes 416, 418, respectively. Interconnect layers, such as vias and upper metal layers, are disposed over the metal gate electrodes 416, 418, but are not shown for purposes of simplicity.

Although some examples above depict the first and second transistor structures (e.g., 304, 306 in FIGS. 3A-3F) have a common or shared source/drain region (e.g., 316) and have source/drain regions of the same conductivity type, it will be appreciated that this is not required. In other embodiments, the neighboring transistor structures can have separate source/drain regions instead of a shared source/drain region, and one transistor can be p-type while the other transistor can be n-type. That being said, the second source/drain region being shared between the first and second transistor structures puts the transistors in closer proximity to one another and makes them more prone to filling issues (e.g., formations of voids) which can be alleviated with the pre-shaping techniques proposed herein.

Further, although some illustrative techniques have been described above with regards to neighboring gate electrodes, the concept is not limited to this technology area. The concepts disclosed herein are also applicable to any number of other scenarios where sidewall topologies are to be pre-shaped to limit defects.

Therefore, it will be appreciated that some embodiments relate to an integrated circuit (IC). The IC includes a semiconductor substrate having an upper substrate surface with a source region and drain region proximate thereto. A channel region is disposed in the substrate between the source region and the drain region. A gate electrode is disposed over the channel region and is separated from the channel region by a gate dielectric. Sidewall spacers are formed about opposing sidewalls of the gate electrode, wherein upper outer edges of the sidewall spacers extend outward beyond corresponding lower outer edges of the sidewall spacers. A liner is disposed about opposing sidewalls of the sidewall spacers and has a first thickness at an upper portion of liner and a second thickness at a lower portion of the liner. The first thickness is less than the second thickness.

Other embodiments relate to an integrated circuit (IC). The integrated circuit include a semiconductor substrate having an upper surface with neighboring first and second gate electrodes disposed thereover. Sidewall spacers are formed on opposing sidewalls of the first and second gate electrodes. A liner layer is conformally disposed about opposite sides of the sidewall spacers, wherein an outer sidewall of the liner layer lies generally about a line traversing the upper surface of the substrate at an obtuse or right angle. The obtuse or right angle is measured from the upper surface of the semiconductor substrate to the outer sidewall of the liner layer without passing through the liner layer.

Still another embodiment relates to a method of manufacturing an IC. In this method, a semiconductor substrate is provided with a sacrificial gate electrode disposed over an upper surface of the substrate. Sidewall spacers are provided about opposing sidewalls of the sacrificial gate electrode, wherein the sidewall spacers are tapered from top to bottom so a base region of the sidewall spacers is narrower than an upper region of the sidewall spacers. A liner layer is formed over the sidewall spacers, wherein sidewalls of the liner layer are tapered from top to bottom so a base region of the liner disposed about the sidewall spacers is narrower than an upper region of the line disposed about the sidewall spacers. The liner layer is then pre-shaped to thin the upper region of the liner so an outer sidewall of the sidewall spacer extends along a line that traverses the upper surface of the substrate at an acute angle. The acute angle is measured from the upper surface of the substrate to the outer sidewall of the liner without passing through the liner.

It will be appreciated that identifiers such as "first" and "second" do not imply any type of ordering or placement with respect to other elements; but rather "first" and "second" and other similar identifiers are just generic identifiers. In addition, it will be appreciated that the term "electrically connected" includes direct and indirect connections. For example, if element "a" is electrically connected to element "b", element "a" can be electrically connected directly to element "b" and/or element "a" can be electrically connected to element "b" through element "c", so long as there is an operable electrical connection between elements "a" and "b".

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. An integrated circuit (IC), comprising:
a semiconductor substrate having an upper surface with a source region and drain region proximate thereto, wherein a channel region is disposed in the substrate between the source region and the drain region;
a gate electrode disposed over the channel region and separated from the channel region by a gate dielectric;
sidewall spacers formed about opposing sidewalls of the gate electrode, wherein upper outer edges of the sidewall spacers extend outward beyond corresponding lower outer edges of the sidewall spacers; and
a liner layer disposed about opposing sidewalls of the sidewall spacers and having a first thickness at an upper portion of liner and a second thickness at a lower portion of the liner layer, the first thickness being less than the second thickness.

2. The IC of claim 1, wherein an outer sidewall of the liner layer lies generally about a line traversing the upper surface of the substrate at an obtuse or right angle, the obtuse or right angle being measured from the upper surface of the substrate to the outer sidewall of the liner layer without passing through the liner layer.

3. The IC of claim 1, wherein an outer sidewall of the gate electrode extends along a line that traverses the upper surface of the substrate at an acute angle, the acute angle measured from the upper surface of the substrate to the outer sidewall of the gate electrode without passing through the gate electrode.

4. The IC of claim 1, wherein an outer sidewall of a sidewall spacer extends along a line that traverses the upper surface of the substrate at an acute angle, the acute angle measured from the upper surface of the substrate to the outer sidewall of the sidewall spacer without passing through the sidewall spacer.

5. The IC of claim 1, wherein the gate electrode comprises a metal gate electrode.

6. The IC of claim 1, wherein the liner layer comprises silicon nitride, oxide, or oxynitride.

7. An integrated circuit (IC), comprising:
a semiconductor substrate having an upper surface with neighboring first and second gate electrodes disposed thereover;
sidewall spacers formed on opposing sidewalls of the first and second gate electrodes; and
a liner layer conformally disposed about opposite sides of the sidewall spacers, wherein an outer sidewall of the liner layer lies generally about a line traversing the upper surface of the substrate at an obtuse or right angle, the obtuse or right angle being measured from the upper surface of the semiconductor substrate to the outer sidewall of the liner layer without passing through the liner layer;
wherein an outer sidewall of the sidewall spacer extends along a line that traverses the upper surface of the substrate at an acute angle, the acute angle measured from the upper surface of the substrate to the outer sidewall of the sidewall spacer without passing through the sidewall spacer.

8. The IC of claim 7, wherein the obtuse or right angle is greater than or equal to 90° and less than approximately 120°.

9. The IC of claim 7, wherein the acute angle is greater than 60° and less than 90°.

10. An integrated circuit (IC), comprising:
a semiconductor substrate having an upper surface with neighboring first and second gate electrodes disposed thereover;
sidewall spacers formed on opposing sidewalls of the first and second gate electrodes; and
a liner layer conformally disposed about opposite sides of the sidewall spacers, wherein an outer sidewall of the liner layer lies generally about a line traversing the upper surface of the substrate at an obtuse or right angle, the obtuse or right angle being measured from the upper surface of the semiconductor substrate to the outer sidewall of the liner layer without passing through the liner layer; and
wherein an outer sidewall of the gate electrode extends along a line that traverses the upper surface of the semiconductor substrate at an acute angle, the acute angle measured from the upper surface of the semiconductor substrate to the outer sidewall of the gate electrode without passing through the gate electrode.

11. The IC of claim 7, further comprising:
a shared source/drain region disposed in the semiconductor substrate between the first and second gate electrodes, wherein the shared source/drain region acts as a source/drain region for respective transistors associated with the first and second gate electrodes, respectively.

12. The IC of claim 7, wherein the first and second neighboring gate electrodes are separated by less than approximately 100 nm.

13. The IC of claim 7, further comprising:
an interlayer dielectric disposed between the neighboring first and second gate electrodes and wherein the interlayer dielectric is substantially free of voids.

14. An integrated circuit (IC), comprising:
a semiconductor substrate having an upper surface with a source region and drain region proximate thereto, wherein a channel region is disposed in the substrate between the source region and the drain region;
a gate electrode disposed over the channel region and separated from the channel region by a gate dielectric, wherein upper outer edges of the gate electrode extend outward beyond corresponding lower outer edges of the gate electrode;
sidewall spacers formed about opposing sidewalls of the gate electrode, wherein upper outer edges of the sidewall spacers extend outward beyond corresponding lower outer edges of the sidewall spacers;

a liner layer disposed about opposite sides of the sidewall spacers, wherein an outer sidewall of the liner layer lies generally about a line traversing the upper surface of the substrate at an obtuse or right angle, the obtuse or right angle being measured from the upper surface of the semiconductor substrate to the outer sidewall of the liner layer without passing through the liner layer.

15. The IC of claim 14, wherein the obtuse or right angle is greater than or equal to 90° and less than approximately 120°.

16. The IC of claim 14, wherein an outer sidewall of a sidewall spacer extends along a line that traverses the upper surface of the substrate at an acute angle, the acute angle measured from the upper surface of the substrate to the outer sidewall of the sidewall spacer without passing through the sidewall spacer.

17. The IC of claim 16, wherein the acute angle is greater than 60° and less than 90°.

18. The IC of claim 14, wherein a sidewall of the gate electrode is separated by less than approximately 100 nm from an adjacent sidewall of a neighboring gate electrode.

19. An integrated circuit (IC), comprising:
  a semiconductor substrate having an upper surface with a gate electrode disposed thereover;
  sidewall spacers formed on opposing sidewalls of the gate electrode; and
  a liner layer conformally disposed about outer sides of the sidewall spacers, wherein an outer sidewall of the liner layer lies generally about a line which traverses the upper surface of the substrate at an obtuse angle, the obtuse angle being measured from the upper surface of the semiconductor substrate to the outer sidewall of the liner layer without passing through the liner layer.

* * * * *